United States Patent
Park et al.

(10) Patent No.: US 9,214,278 B2
(45) Date of Patent: Dec. 15, 2015

(54) MULTILAYERED CERAMIC ELECTRONIC COMPONENT AND BOARD FOR MOUNTING THE SAME

(71) Applicant: SAMSUNG ELECTRO-MECHANICS CO., LTD., Suwon (KR)

(72) Inventors: Myung Jun Park, Gyunggi-Do (KR); Kyu Sik Park, Gyunggi-Do (KR); Young Sook Lee, Gyunggi-Do (KR); Jae Yeol Choi, Gyunggi-Do (KR); Doo Young Kim, Gyunggi-Do (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 117 days.

(21) Appl. No.: 13/715,954

(22) Filed: Dec. 14, 2012

(65) Prior Publication Data

US 2014/0124251 A1    May 8, 2014

(30) Foreign Application Priority Data

Nov. 7, 2012    (KR) .................. 10-2012-0125349

(51) Int. Cl.
*H01G 4/00* (2006.01)
*H01G 4/12* (2006.01)
(Continued)

(52) U.S. Cl.
CPC .............. *H01G 4/12* (2013.01); *H01F 17/0013* (2013.01); *H01G 4/232* (2013.01); *H01G 4/2325* (2013.01);
(Continued)

(58) Field of Classification Search
CPC ........... H01G 4/12; H01G 4/005; H01G 4/30; H01G 4/232; H01G 4/252; H01G 4/012; H01G 4/01; H01G 4/2325; H01G 4/228; H05K 1/16; H05K 1/162; H05K 2201/10015; H05K 2201/2045

USPC ............ 361/301.1, 303, 306.3, 321.2, 321.4, 361/301.4, 311; 174/257
See application file for complete search history.

(56) References Cited

U.S. PATENT DOCUMENTS 6,903,919 B2    6/2005   Kayatani et al.
8,587,919 B2 *  11/2013  Ogawa et al. .............. 361/301.4
(Continued)

FOREIGN PATENT DOCUMENTS

JP    6-11337 U    2/1994
JP    10-270288   10/1998
(Continued)

OTHER PUBLICATIONS

Notice of Office Action Korean Patent Application No. 10-2012-0125349 dated Dec. 23, 2013 with English translation.
(Continued)

*Primary Examiner* — Lisa Lea Edmonds
*Assistant Examiner* — Christopher L Augustin
(74) *Attorney, Agent, or Firm* — McDermott Will & Emery LLP (57) ABSTRACT

There is provided a multilayered ceramic electronic component including: a ceramic body including a dielectric layer and having first and second side surfaces; first and second internal electrodes having an overlapping region provided in the ceramic body, forming a capacitance forming area exposed to the first side surface, the first internal electrode having a first lead-out portion, and the second internal electrode being insulated from the first internal electrode and having a second lead-out portion; a first external electrode connected to the first lead-out portion and a second external electrode connected to the second lead-out portion; and an insulating layer formed on the first side surface, wherein the first and second external electrodes further include non-conductive layers formed on outer surfaces thereof.

14 Claims, 3 Drawing Sheets

(51) Int. Cl.
*H01F 17/00* (2006.01)
*H05K 3/34* (2006.01)
*H01G 4/30* (2006.01)
*H01G 4/232* (2006.01)

(52) U.S. Cl.
CPC .............. *H01G 4/30* (2013.01); *H05K 3/3442* (2013.01); *H05K 2201/10015* (2013.01); *H05K 2201/2045* (2013.01)

(56) References Cited

U.S. PATENT DOCUMENTS

| | | | | |
|---|---|---|---|---|
| 8,614,877 | B2* | 12/2013 | Kim | 361/321.2 |
| 8,630,080 | B2* | 1/2014 | Iwanaga et al. | 361/301.1 |
| 9,001,491 | B2* | 4/2015 | Lee et al. | 361/301.4 |
| 2008/0144253 | A1* | 6/2008 | Togashi | 361/301.4 |
| 2011/0096464 | A1 | 4/2011 | Togashi et al. | |
| 2011/0235234 | A1* | 9/2011 | Yamamoto et al. | 361/321.1 |
| 2012/0069489 | A1* | 3/2012 | Takeuchi et al. | 361/321.1 |
| 2013/0057112 | A1* | 3/2013 | Shirakawa et al. | 310/311 |

FOREIGN PATENT DOCUMENTS

| | | |
|---|---|---|
| JP | 2002359103 A | 12/2002 |
| JP | 2003-109838 A | 4/2003 |
| JP | 2004-259736 A | 9/2004 |
| JP | 2005-243944 A | 9/2005 |
| JP | 2009-054973 A | 3/2009 |
| JP | 2011091271 A | 5/2011 |
| JP | 2012064779 A | 3/2012 |
| JP | 201358558 A | 3/2013 |
| WO | 2012137569 A1 | 10/2012 |

OTHER PUBLICATIONS

Examination Report dated Mar. 26, 2014 issued in the corresponding Taiwanese Patent Application No. 101147768.

Japanese Office Action with full English Translation issued in Japanese Patent Application No. 2012-272817 mailed Sep. 24, 2013.

* cited by examiner

MULTILAYERED CERAMIC ELECTRONIC COMPONENT AND BOARD FOR MOUNTING THE SAME

CROSS-REFERENCE TO RELATED APPLICATIONS

This application claims the priority of Korean Patent Application No. 10-2012-0125349 filed on Nov. 7, 2012, in the Korean Intellectual Property Office, the disclosure of which is incorporated herein by reference.

BACKGROUND OF THE INVENTION

1. Field of the Invention

The present invention relates to a multilayered ceramic electronic component capable of decreasing acoustic noise generated by the multilayered ceramic electronic component when a voltage is applied thereto, and a board for mounting the same.

2. Description of the Related Art

Examples of an electronic component using a ceramic material include a capacitor, an inductor, a piezoelectric material, a varistor, a thermistor, and the like.

Among these ceramic electronic components, a multilayered ceramic capacitor (MLCC) has compactness, high capacitance, ease of mounting, and the like.

A multilayered ceramic capacitor is a chip type condenser mounted on a circuit board of electronic products such as computers, personal digital assistants (PDAs), and cellular phones, to perform an important role in charging and discharging electricity and has various sizes and multilayered forms, according to use and required capacitance.

In particular, recently, in accordance with the miniaturization of electronic products, a subminiature size and ultra high capacitance have been demanded in a multilayered ceramic capacitor used in miniaturized electronic products.

Therefore, a multilayered ceramic capacitor in which thicknesses of dielectric layers and internal electrodes are reduced in order to allow the electronic product to have a subminiature size and an increased amount of dielectric layers provided with internal electrodes thereon are provided in order to allow the electronic product to have ultra high capacitance has been manufactured.

Meanwhile, there is provided a multilayered ceramic capacitor in which all external electrodes are positioned on a lower surface thereof. The multilayered ceramic capacitor having this structure has advantages in that mounting density and capacitance thereof are excellent and equivalent series inductance (ESL) is low, but has a defect in which adhesion strength is relatively low and one surface of a multilayered body may be bent, such that cracks may be generated.

In order to solve the above-mentioned defects, a relatively large amount of solder fillet has been used at the time of mounting the multilayered ceramic capacitor on the printed circuit board.

In this case, due to a phenomenon in which the solder fillet overflows at the time of reflow, a defect may occur or a mounting area of the multilayered ceramic capacitor may be increased.

In addition, due to the above-mentioned defect, vibrations are transferred to the printed circuit board, such that an acoustic noise phenomenon may increase.

Therefore, research into a technology capable of decreasing the acoustic noise phenomenon simultaneously with decreasing the mounting area of the multilayered ceramic capacitor has been required.

In the following Patent Document, Patent Document 1 discloses a ceramic electronic component in which a conductive resin layer is deposited on an end portion of a metal plated layer on a main surface of a multilayered body in order to enhance impact resistance. In addition, the following Patent Document discloses a ceramic electronic component capable of preventing solder overflow in welding by adjusting thicknesses of a palladium (Pd) plated layer and a gold (Au) plated layer that form external electrodes.

However, these Patent Documents neither disclose nor anticipate a feature of preventing solder overflow in welding using a nonconductor layer that is suggested in the claims and embodiments of the present invention.

RELATED ART DOCUMENT (Patent Document 1) Japanese Patent Laid-Open Publication No. 2005-243944
(Patent Document 2) Japanese Patent Laid-Open Publication No. 2003-109838

SUMMARY OF THE INVENTION

An aspect of the present invention provides a multilayered ceramic electronic component in which a mounting area may be decreased by preventing solder from overflowing onto an upper portion of the multilayered ceramic electronic component in a thickness direction when a printed circuit board and the multilayered ceramic electronic component are soldered to each other.

Another aspect of the present invention provides a board for mounting a multilayered ceramic electronic component capable of decreasing acoustic noise by mounting the multilayered ceramic electronic component on a printed circuit board.

According to an aspect of the present invention, there is provided a multilayered ceramic electronic component including: a ceramic body including a dielectric layer and having first and second main surfaces opposing each other, first and second side surfaces opposing each other, and first and second ends opposing each other; first and second internal electrodes having an overlapping region provided in the ceramic body, forming a capacitance forming area exposed to the first side surface, the first internal electrode having a first lead-out portion extended from the capacitance forming area so as to be exposed to the first side surface, and the second internal electrode being insulated from the first internal electrode and having a second lead-out portion extended from the capacitance forming area so as to be exposed to the first side surface; a first external electrode connected to the first lead-out portion and extended to the first end of the ceramic body, and a second external electrode connected to the second lead-out portion and extended to the second end of the ceramic body; and an insulating layer formed on the first side surface of the ceramic body, wherein the first and second external electrodes formed on the first and second ends further include non-conductive layers formed on outer surfaces thereof.

The non-conductive layers may include at least one selected from a group consisting of epoxy, a heat resistant polymer, glass, and ceramic.

The first and second internal electrodes may be disposed perpendicularly with regard to a mounting surface of the ceramic body.

The first external electrode may be extended to at least one of the first main surface, the second main surface, and the second side surface of the ceramic body.

The second external electrode may be extended to at least one of the first main surface, the second main surface, and the second side surface of the ceramic body.

The insulating layer may include at least one selected from a group consisting of epoxy, a heat resistant polymer, glass, and ceramic.

The insulating layer may cover the entirety of the exposed portions of the first and second internal electrodes overlapped with each other.

The insulating layer may have a thickness lower than those of the first and second external electrodes measured from the first side surface of the ceramic body.

According to another aspect of the present invention, there is provided a board for mounting a multilayered ceramic electronic component, the board including: the multilayered ceramic electronic component as described above; electrode pads connected to the external electrodes of the multilayered ceramic electronic component using solder fillets; and a printed circuit board having the electrode pads formed therein, wherein the solder fillets are formed up to one end of the non-conductive layers adjacent to the printed circuit board.

The non-conductive layers may include at least one selected from a group consisting of epoxy, a heat resistant polymer, glass, and ceramic.

The first and second internal electrodes may be disposed perpendicularly with regard to amounting surface of the ceramic body.

The first external electrode may be extended to at least one of the first main surface, the second main surface, and the second side surface of the ceramic body.

The second external electrode may be extended to at least one of the first main surface, the second main surface, and the second side surface of the ceramic body.

The insulating layer may include at least one selected from a group consisting of epoxy, a heat resistant polymer, glass, and ceramic.

The insulating layer may cover the entirety of the exposed portions of the first and second internal electrodes overlapped with each other.

The insulating layer may have a thickness lower than those of the first and second external electrodes measured from the first side surface of the ceramic body.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Figure 1:
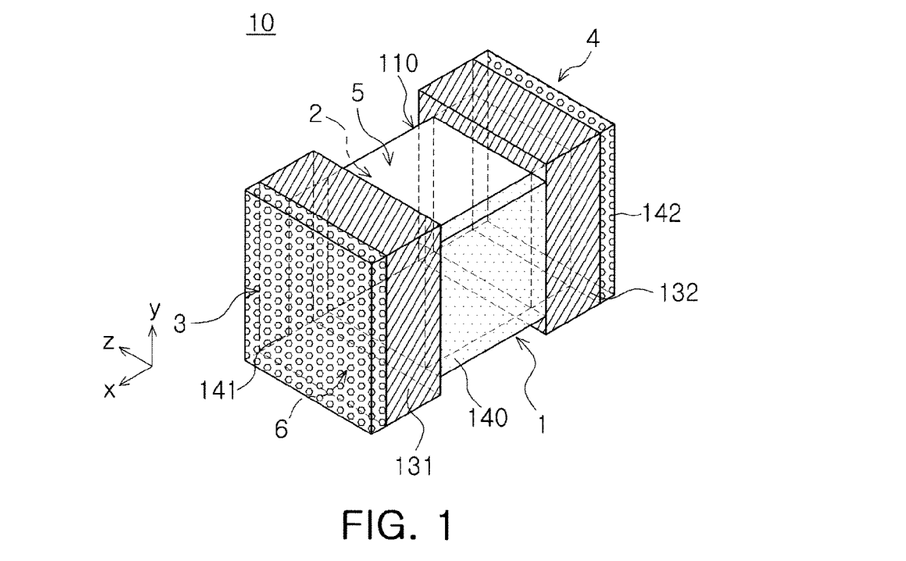
FIG. 1 is a schematic perspective view showing a multi-layered ceramic capacitor according to an embodiment of the present invention.

FIG. 1 is a schematic perspective view showing a multilayered ceramic capacitor according to an embodiment of the present invention.

Figure 2:
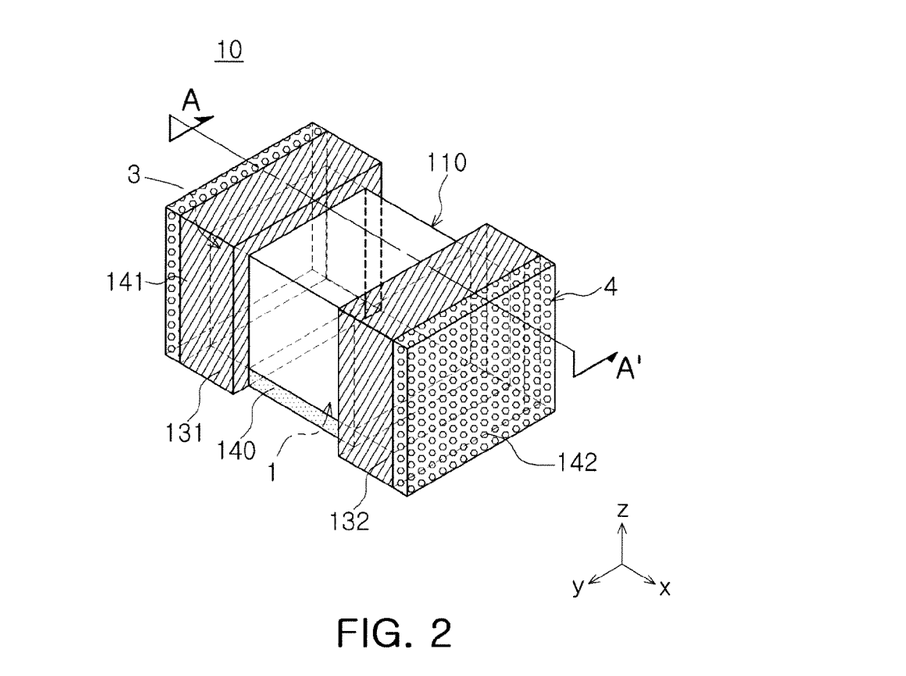
FIG. 2 is a schematic perspective view showing the multi-layered ceramic capacitor according to the embodiment of the present invention viewed in a different direction.

FIG. 2 is a schematic perspective view showing a multilayered ceramic capacitor according to an embodiment of the present invention.

Figure 3:
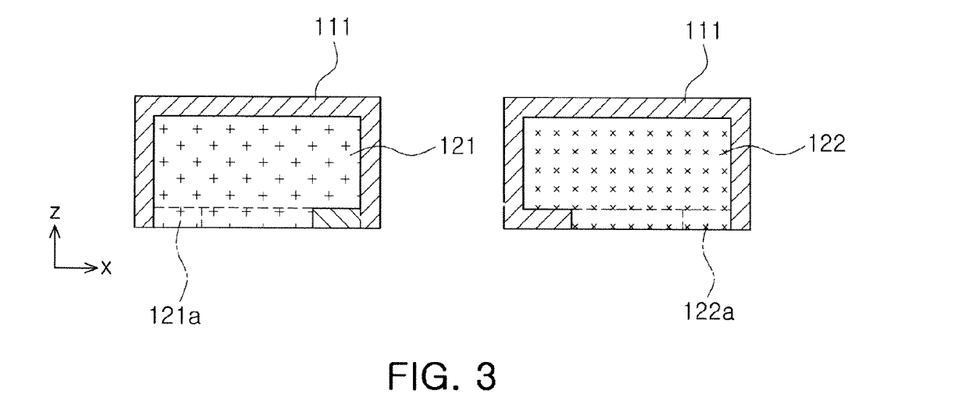
FIG. 3 is a cross-sectional view showing a structure of internal electrodes of the multilayered ceramic capacitor shown in FIGS. 1 and 2.

FIG. 3 is a cross-sectional view showing a structure of internal electrodes of the multilayered ceramic capacitor shown in FIGS. 1 and 2.

Figure 4:
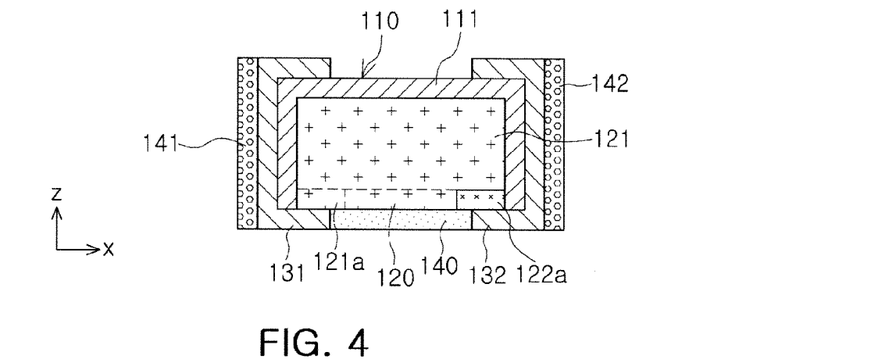
FIG. 4 is a cross-sectional view taken along line A-A' of FIG. 2.

FIG. 4 is a cross-sectional view taken along line A-A' of FIG. 2.

The multilayered ceramic capacitor according to the present embodiment may be a two-terminal vertically laminated or vertical multilayer capacitor. The "vertically laminated or vertical multilayer" refers that multilayered internal electrodes within a capacitor are disposed perpendicularly with regard to a mounting region surface of a circuit board, and the "two-terminal" refers that two terminals are connected as terminals of the capacitor to the circuit board.

Referring to FIGS. 1 through 4, the multilayered ceramic capacitor 10 according to the embodiment of the present invention may include a ceramic body 110; internal electrodes 121 and 122 formed in the ceramic body; an insulation layer 140 formed on one surface of the ceramic body; and external electrodes 131 and 132.

According to the present embodiment, the ceramic body 110 may have first and second main surfaces 5 and 6 opposing each other, first and second side surfaces 1 and 2 that connect the first and second main surfaces 5 and 6 to each other, and first and second ends 3 and 4. A shape of the ceramic body is not particularly limited, but may be a hexahedral shape as shown in FIGS. 1 and 2. According to the embodiment of the present invention, the first side surface 1 of the ceramic body may be a mounting surface disposed in a mounting region of a circuit board.

According to the embodiment of the present invention, an x-direction refers to a direction in which first and second external electrodes are formed, having a predetermined interval therebetween, a y-direction refers to a direction in which the internal electrodes are stacked, having a dielectric layer therebetween, and a z-direction refers to a direction in which the internal electrodes are mounted on the circuit board.

According to the embodiment of the present invention, the ceramic body 110 may be formed by multi-layering a plurality of dielectric layers 111. The plurality of dielectric layers 111 configuring the ceramic body 110 may be in a sintered state and may be integrated with each other so as not to confirm a boundary between dielectric layers adjacent to each other.

The dielectric layer 111 may be formed by firing a ceramic green sheet including a ceramic powder, an organic solvent, and an organic binder. As the ceramic powder, a high k material, a barium titanate ($BaTiO_3$) based material, a strontium titanate (SrTiO$_3$) based material, or the like, may be used. However, the ceramic powder is not limited thereto.

According to the embodiment of the present invention, the ceramic body 110 may include the internal electrodes formed therein.

FIG. 3 is a cross-sectional view showing the dielectric layer 111 and the internal electrodes 121 and 122 formed on the dielectric layer, configuring the ceramic body 110.

According to the embodiment of the present invention, the first internal electrode 121 having a first polarity and the second internal electrode 122 having a second polarity may be formed in a pair and may be disposed in the y-direction so as to face each other, having the dielectric layer 111 therebetween.

According to the embodiment of the present invention, the first and second internal electrodes 121 and 122 may be disposed perpendicularly with regard to the mounting surface, that is, the first side surface 1, of the multilayered ceramic capacitor.

In the embodiment of the present invention, the first and second polarities refer to different polarities.

According to the embodiment of the present invention, the first and second internal electrodes 121 and 122 may be formed of a conductive paste including a conductive metal.

The conductive metal may be nickel (Ni), copper (Cu), palladium (Pd), or an alloy thereof, but is not limited thereto.

The internal electrode may be printed on a ceramic green sheet configuring the dielectric layer using a conductive paste by a printing method such as a screen printing method or a gravure printing method.

The ceramic green sheets having the internal electrode printed thereon may be alternately stacked and fired to form the ceramic body.

The multilayered ceramic capacitor 10 according to the embodiment of the present invention may include first and second internal electrodes 121 and 122 having an overlapping region provided in the ceramic body 110, forming a capacitance forming area 120 exposed to the first side surface 1, the first internal electrode 121 having a first lead-out portion 121*a* extended from the capacitance forming area 120 so as to be exposed to the first side surface 1, and the second internal electrode 122 being insulated from the first internal electrode 121 and having a second lead-out portion 122*a* extended from the capacitance forming area 120 so as to be exposed to the first side surface 1.

The first and second internal electrodes 121 and 122 have first and second lead-out portions 121*a* and 122*a*, respectively, so as to be connected to the external electrodes having different polarities, wherein the first and second lead-out portions 121*a* and 122*a* may be exposed to the first side surface 1 of the ceramic body 110.

According to the embodiment of the present invention, in the multilayered ceramic capacitor, the vertically laminated or vertical multilayer capacitor, the first and second lead-out portions 121*a* and 122*a* may be exposed to the same surface of the ceramic body.

According to the embodiment of the present invention, the lead-out portion of the internal electrode may refer to a region in which a conductor pattern forming the internal electrode has an increased width to thereby be exposed to one surface of the ceramic body.

Generally, the first and second internal electrodes may form capacitance in a region in which the first and second internal electrodes overlap with each other, and the lead-out portions connected to the external electrodes having different polarities do not have a region overlapped with each other.

According to the embodiment of the present invention, the overlapping region forming the capacitance forming area 120 may be exposed to the first side surface 1, the first internal electrode 121 may have the first lead-out portion 121*a* extended from the capacitance forming area 120 so as to be exposed to the first side surface 1, and the second internal electrode 122 may have the second lead-out portion 122*a* extended from the capacitance forming area 120 so as to be exposed to the first side surface 1.

The first and second lead-out portions 121*a* and 122*a* are not overlapped with each other, such that the first and second internal electrodes 121 and 122 may be insulated from each other.

As described above, according to the embodiment of the present invention, the overlapping region forming the capacitance forming area 120 is formed in the ceramic body 110 so as to be exposed to the first side surface 1, whereby capacitance of the multilayered ceramic capacitor 10 may be increased.

In addition, a distance between the first and second internal electrodes to which voltages having different polarities are applied from the outside is reduced, such that a current loop may be shortened. Therefore, equivalent series inductance (ESL) may be decreased.

Referring to FIG. 4, the first external electrode 131 may be connected to the first lead-out portion 121*a* of the first internal electrode exposed to the first side surface of the ceramic body, and the second external electrode 132 may be connected to the second lead-out portion 122*a* of the second internal electrode exposed to the first side surface of the ceramic body.

The first external electrode 131 may be formed on the first side surface 1 of the ceramic body so as to be connected to the first lead-out portion 121*a* and may be extended to the first end 3 of the ceramic body, but is not limited thereto.

The second external electrode 132 may be formed on the first side surface 1 of the ceramic body so as to be connected to the second lead-out portion 122*a* and may be extended to the second end 4 of the ceramic body, but is not limited thereto.

That is, the first external electrode 131 may be extended to at least one of the first main surface 5, the second main surface 6, and the second side surface 2 of the ceramic body 110.

In addition, the second external electrode 132 may be extended to at least one of the first main surface 5, the second main surface 6, and the second side surface 2 of the ceramic body 110.

Therefore, according to the embodiment of the present invention, the first external electrode 131 may enclose one end portion of the ceramic body 110 in a length direction while being connected to the first lead-out portion 121*a* of the first internal electrode 121 exposed to the first side surface 1 of the ceramic body 110.

In addition, the second external electrode 132 may enclose the other end portion of the ceramic body 110 in the length direction while being connected to the second lead-out portion 122*a* of the second internal electrode 122 exposed to the first side surface 1 of the ceramic body 110.

The first and second external electrodes 131 and 132 may be formed of a conductive paste including a conductive metal.

The conductive metal may be nickel (Ni), copper (Cu), tin (Sn), or an alloy thereof, but is not limited thereto.

The conductive paste may further include an insulating material. The insulating material may be, for example, glass, but is not limited thereto.

A method of forming the first and second external electrodes 131 and 132 is not particularly limited. That is, the first and second external electrodes 131 and 132 may be formed by dipping the ceramic body in a conductive paste or may be formed by a method such as a plating method, or the like.

According to the embodiment of the present invention, non-conductive layers 141 and 142 may be further formed on an outer portion of the first and second external electrodes 131 and 132 formed on the first and second ends 3 and 4.

A plating layer (not shown) may be coated on the first and second external electrodes 131 and 132 except for the non-conductive layers 141 and 142 in an electroplating scheme.

The non-conductive layers 141 and 142 may prevent the plating layer from being coated.

In addition, as described below, when the multilayered ceramic capacitor is surface-mounted on the printed circuit board, the non-conductive layers 141 and 142 may prevent solder paste formed on an electrode pad from being wetted, such that they may not be smeared with solder.

Therefore, when the multilayered ceramic capacitor is surface-mounted on the printed circuit board, the non-conductive layers 141 and 142 may decrease a thickness of a solder fillet fixing the multilayered ceramic capacitor to the printed circuit board.

The plating layer may include at least one of copper (Cu), nickel (Ni), and tin (Sn), but is not limited thereto.

The non-conductive layers 141 and 142 may also be extended up to portions of band parts of the first and second external electrodes 131 and 132 and significantly decrease the thickness of the solder fillet when the multilayered ceramic capacitor is formed on the printed circuit board.

The plating layer may also be formed only at the band parts of the first and second external electrodes 131 and 132.

Meanwhile, the non-conductive layers 141 and 142 may include at least one selected from a group consisting of epoxy, a heat resistant polymer, glass, and ceramic, but is not limited thereto.

The multilayered ceramic capacitor 10 according to the embodiment of the present invention further includes the non-conductive layers 141 and 142 respectively formed on the outer portions of the first and second external electrodes 131 and 132 formed on the first and second ends 3 and 4, whereby a mounting area may be significantly decreased at the time of mounting the multilayered ceramic capacitor 10 on the printed circuit board.

A detailed description of a feature of mounting the above-mentioned multilayered ceramic capacitor on the printed circuit board will be provided below.

Meanwhile, according to the embodiment of the present invention, as shown in FIG. 4, the insulation layer 140 may be formed on the first side surface of the ceramic body 110.

The insulation layer 140 may be formed between the first and second external electrodes 131 and 132.

The insulation layer 140 may cover the capacitance forming area 120 exposed to the first side surface and may cover the entire overlapping region of the first and second internal electrodes 121 and 122.

According to the embodiment of the present invention, as shown in FIG. 4, the insulation layer 140 may completely fill one surface of the ceramic body between the first and second external electrodes.

Further, although not shown, according to the embodiment of the present invention, the insulation layer 140 may cover only the overlapping region of the first and second internal electrodes 121 and 122 and be formed so as to have a predetermined interval from the first and second external electrodes 131 and 132.

According to the embodiment of the present invention, the insulation layer 140 may have a thickness lower than that of the first external electrode 131 or the second external electrode 132. The thicknesses of the insulation layer and the external electrodes may be measured based on a mounting surface, that is, the first side surface.

According to the embodiment of the present invention, the insulation layer has a thickness lower than those of the first and second external electrodes, such that the multilayered ceramic capacitor 10 may be more stably mounted on the circuit board.

In addition, the first and second external electrodes 131 and 132 may be formed on a portion of the first side surface of the ceramic body.

The insulating layer 140 may include at least one selected from a group consisting of, for example, epoxy, a heat resistant polymer, glass, and ceramic, but is not limited thereto.

According to the embodiment of the present invention, the insulation layer 140 may be formed of a ceramic slurry.

A formation position and a thickness of the insulation layer 140 may be adjusted by adjusting an amount and a shape of the ceramic slurry.

The insulation layer 140 may be formed by applying a ceramic slurry to the ceramic body formed by a firing process and then firing the ceramic slurry.

Alternatively, the insulation layer 140 may be formed by forming a ceramic slurry configuring the insulation layer on a ceramic green sheet configuring the ceramic body and then firing the ceramic slurry together with the ceramic green sheet.

A method of applying the ceramic slurry is not particularly limited. For example, the ceramic slurry may be sprayed by a spray method or may be applied using a roller.

The insulation layer 140 may cover the overlapping region of the first and second internal electrodes exposed to one surface of the ceramic body to prevent short-circuits between the internal electrodes and prevent an internal defect such as a deterioration in humidity resistance characteristics, or the like.

According to the embodiment of the present invention, the overlapping region is even formed in portions of the first and second internal electrodes exposed to the first side surface, whereby capacitance of the multilayered ceramic capacitor may be increased.

In addition, a distance between the first and second internal electrodes to which voltages having different polarities are applied from the outside becomes relatively close, such that a current loop may be shortened. Therefore, ESL may be decreased.

Figure 5:
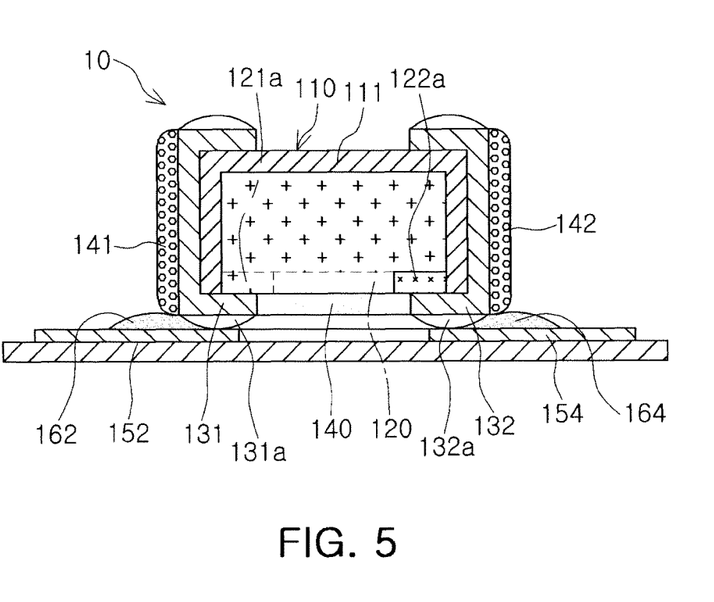
FIG. 5 is a schematic perspective view schematically showing a form in which the multilayered ceramic capacitor according to the embodiment of the present invention is mounted on a printed circuit board.

FIG. 5 is a schematic perspective view schematically showing a form in which the multilayered ceramic capacitor according to the embodiment of the present invention is mounted on a printed circuit board.

Referring to FIG. 5, a board for mounting a multilayered ceramic electronic component according to another embodiment of the present invention may include the multilayered ceramic electronic component according to the embodiment of the present invention described above; electrode pads 152 and 154 connected to the external electrodes 131 and 132 of the multilayered ceramic electronic component using solder fillets 162 and 164, respectively; and a printed circuit board 200 having the electrode pads 152 and 154 formed thereon, wherein the solder fillets 162 and 164 may be formed up to one end of the non-conductive layers 141 and 142 adjacent to the printed circuit board 200.

The non-conductive layers 141 and 142 may include at least one selected from a group consisting of epoxy, a heat resistant polymer, glass, and ceramic.

The first and second internal electrodes 121 and 122 may be disposed perpendicularly with regard to a mounting surface of the ceramic body 110.

The first external electrode 131 may be extended to at least one of the first main surface, the second main surface, and the second side surface of the ceramic body 110.

The second external electrode 132 may be extended to at least one of the first main surface, the second main surface, and the second side surface of the ceramic body 110.

The insulating layer 140 may include at least one selected from a group consisting of epoxy, a heat resistant polymer, glass, and ceramic.

The insulating layer 140 may cover the entirety of the exposed portions of the first and second internal electrodes 121 and 122 overlapped with each other.

The insulating layer 140 may have a thickness lower than those of the first and second external electrodes 131 and 132 measured from the first side surface of the ceramic body 110.

Hereinafter, components different from those of the embodiment of the present invention described above may be mainly described and a detailed description of the same component will be omitted.

The board for mounting a multilayered ceramic electronic component according to another embodiment of the present invention may include the multilayered ceramic electronic component, the electrode pads 152 and 154, and the printed circuit board 200.

The multilayered ceramic electronic component may be the multilayered ceramic capacitor 10 according to the embodiment of the present invention described above.

In addition, the multilayered ceramic capacitor 10 may be mounted on the printed circuit board 200 so that the first and second internal electrodes 121 and 122 are perpendicular with respect to the printed circuit board 200.

In addition, the printed circuit board 200 and plating layers 131*a* and 132*a* of the multilayered ceramic capacitor 10 may be connected to the electrode pads 152 and 154 using the solder fillets 162 and 164.

Further, the solder fillets 162 and 164 may be formed up to one end of the non-conductive layers 141 and 142 adjacent to the printed circuit board 200.

Generally, when a voltage is applied in a state in which the multi layered ceramic capacitor 10 is mounted on the printed circuit board 200, acoustic noise may be generated.

However, according to another embodiment of the present invention, thicknesses of the solder fillets 162 and 164 are decreased, whereby the acoustic noise may be decreased.

That is, according to the embodiment of the present invention, in the case in which the thicknesses of the solder fillets 162 and 164 are defined by the non-conductive layers 141 and 142, the printed circuit board 200 is hardly deformed, such that the acoustic noise may be significantly decreased.

In addition, according to another embodiment of the present invention, the thicknesses of the solder fillets 162 and 164 are decreased, whereby a mounting area may be decreased at the time of mounting the multilayered ceramic capacitor 10 on the printed circuit board 200.

As set forth above, according to the embodiments of the present invention, the overlapped area of the first and second internal electrodes forming the capacitance forming area is increased, whereby capacitance of the multilayer ceramic capacitor may be increased.

In addition, the distance between the first and second internal electrodes to which voltages having different polarities are applied from the outside is reduced, such that the current loop may be shortened. Therefore, the ESL may be decreased.

Further, with the multilayered ceramic capacitor and the board for mounting the same according to the embodiments of the present invention, the mounting area on the printed circuit board may be significantly decreased, and the acoustic noise may be significantly decreased.

While the present invention has been shown and described in connection with the embodiments, it will be apparent to those skilled in the art that modifications and variations can be made without departing from the spirit and scope of the invention as defined by the appended claims.

What is claimed is:

1. A multilayered ceramic electronic component comprising:
    a ceramic body including a dielectric layer and having first and second main surfaces opposing each other, first and second side surfaces opposing each other, and first and second ends opposing each other;
    first and second internal electrodes having an overlapping region provided in the ceramic body, forming a capacitance forming area exposed to the first side surface, the first internal electrode having a first lead-out portion extended from the capacitance forming area so as to be exposed to the first side surface and the second internal electrode being insulated from the first internal electrode and having a second lead-out portion extended from the capacitance forming area so as to be exposed to the first side surface;
    a first external electrode connected to the first lead-out portion and extended to the first end of the ceramic body and a second external electrode connected to the second lead-out portion and extended to the second end of the ceramic body; and
    an insulating layer formed on the first side surface of the ceramic body,
    wherein the first and second external electrodes formed on the first and second ends further including non-conductive layers formed on outer surfaces thereof, and
    wherein the insulating layer has a thickness lower than those of the first and second external electrodes measured from the first side surface of the ceramic body, and when the multilayered ceramic electronic component is surface-mounted on a printed circuit board, the non-conductive layers prevent solder paste formed on an electrode pad from being wetted.

2. The multilayered ceramic electronic component of claim 1, wherein the non-conductive layers include at least one selected from a group consisting of epoxy, a heat resistant polymer, glass, and ceramic.

3. The multilayered ceramic electronic component of claim 1, wherein the first and second internal electrodes are disposed perpendicularly with regard to a mounting surface of the ceramic body.

4. The multilayered ceramic electronic component of claim 1, wherein the first external electrode is extended to at least one of the first main surface, the second main surface, and the second side surface of the ceramic body.

5. The multilayered ceramic electronic component of claim 1, wherein the second external electrode is extended to at least one of the first main surface, the second main surface, and the second side surface of the ceramic body.

6. The multilayered ceramic electronic component of claim 1, wherein the insulating layer includes at least one selected from a group consisting of epoxy, a heat resistant polymer, glass, and ceramic.

7. The multilayered ceramic electronic component of claim 1, wherein the insulating layer covers the entirety of the exposed portions of the first and second internal electrodes overlapped with each other.

8. A board for mounting a multilayered ceramic electronic component, the board comprising:
   the multilayered ceramic electronic component of claim 1;
   electrode pads connected to the external electrodes of the multilayered ceramic electronic component using solder fillets; and
   a printed circuit board having the electrode pads formed therein,
   the solder fillets being formed up to one end of the non-conductive layers adjacent to the printed circuit board.

9. The board of claim 8, wherein the non-conductive layers include at least one selected from a group consisting of epoxy, a heat resistant polymer, glass, and ceramic.

10. The board of claim 8, wherein the first and second internal electrodes are disposed perpendicularly with regard to a mounting surface of the ceramic body.

11. The board of claim 8, wherein the first external electrode is extended to at least one of the first main surface, the second main surface, and the second side surface of the ceramic body.

12. The board of claim 8, wherein the second external electrode is extended to at least one of the first main surface, the second main surface, and the second side surface of the ceramic body.

13. The board of claim 8, wherein the insulating layer includes at least one selected from a group consisting of epoxy, a heat resistant polymer, glass, and ceramic.

14. The board of claim 8, wherein the insulating layer covers the entirety of the exposed portions of the first and second internal electrodes overlapped with each other.

* * * * *